(12) United States Patent
Shin et al.

(10) Patent No.: US 8,198,702 B2
(45) Date of Patent: Jun. 12, 2012

(54) ELECTRICAL FUSE DEVICE

(75) Inventors: Dong-suk Shin, Yongin-si (KR);
Andrew-Tae Kim, Yongin-si (KR);
Hong-jae Shin, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 13/193,637

(22) Filed: Jul. 29, 2011

(65) Prior Publication Data

US 2011/0284988 A1 Nov. 24, 2011

Related U.S. Application Data

(63) Continuation of application No. 12/203,256, filed on Sep. 3, 2008, now Pat. No. 8,013,420.

(30) Foreign Application Priority Data

Sep. 3, 2007 (KR) .................. 10-2007-0089078

(51) Int. Cl.
*H01L 23/525* (2006.01)

(52) U.S. Cl. .. 257/529; 257/530; 257/531; 257/E23.149

(58) Field of Classification Search ................. 257/529, 257/530, 531, E23.149; 438/132, 215, 281
See application file for complete search history.

(56) References Cited

U.S. PATENT DOCUMENTS

| 5,708,291 | A | | 1/1998 | Bohr et al. |
| 5,969,404 | A | | 10/1999 | Bohr et al. |
| 5,976,943 | A | * | 11/1999 | Manley et al. ............ 438/382 |
| 6,166,421 | A | * | 12/2000 | Kalnitsky et al. ......... 257/529 |
| 6,828,652 | B2 | | 12/2004 | Kothandaraman |

FOREIGN PATENT DOCUMENTS

| KR | 1020070015810 A | 2/2007 |
| KR | 1020070025917 A | 3/2007 |

* cited by examiner

*Primary Examiner* — Thinh T Nguyen
(74) *Attorney, Agent, or Firm* — Volentine & Whitt, PLLC

(57) ABSTRACT

The invention relates generally to a fuse device of a semiconductor device, and more particularly, to an electrical fuse device of a semiconductor device. Embodiments of the invention provide a fuse device that is capable of reducing programming error caused by non-uniform current densities in a fuse link. In one respect, there is provided an electrical fuse device that includes: an anode; a fuse link coupled to the anode on a first side of the fuse link; a cathode coupled to the fuse link on a second side of the fuse link; a first cathode contact coupled to the cathode; and a first anode contact coupled to the anode, at least one of the first cathode contact and the first anode contact being disposed across a virtual extending surface of the fuse link.

11 Claims, 6 Drawing Sheets

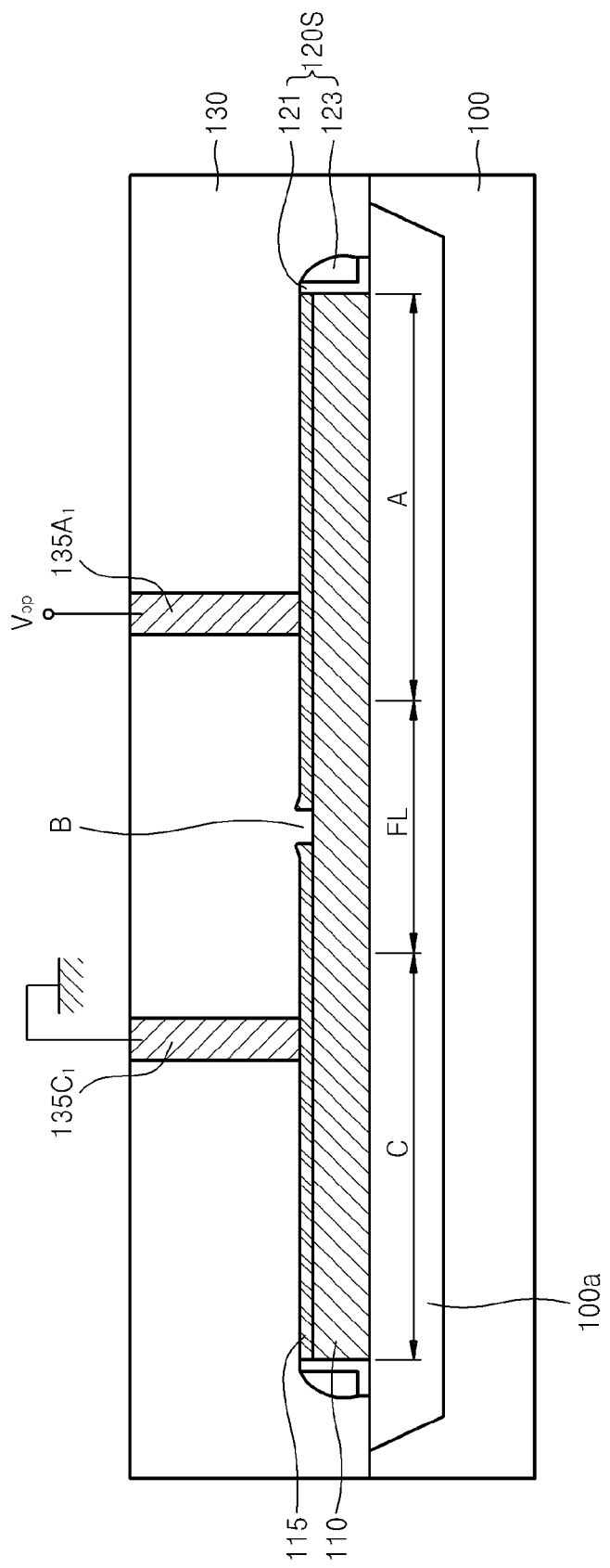

ELECTRICAL FUSE DEVICE

CROSS-REFERENCE TO RELATED PATENT APPLICATION

This application is a Continuation of application Ser. No. 12/203,256, filed Sep. 3, 2008, which claims the benefit of Korean Patent Application No. 10-2007-0089078, filed on Sep. 3, 2007, in the Korean Intellectual Property Office, the disclosure of which is incorporated herein in its entirety by reference.

SUMMARY OF THE INVENTION

The invention relates generally to a fuse device of a semiconductor device, and more particularly, to an electrical fuse device of a semiconductor device.

In an electrical fuse, a programming current flows through a fuse link, causing the link to heat and open. This programming process may also be referred to as blowing the fuse. When a program current density is not sufficiently uniform during the blowing process, the fuse link may be only partially separated. Embodiments of the invention provide a fuse device that is capable of reducing such a programming error.

According to an aspect of the present invention, there is provided an electrical fuse device including: an anode; a fuse link coupled to the anode on a first side of the fuse link; a cathode coupled to the fuse link on a second side of the fuse link; a first cathode contact coupled to the cathode; and a first anode contact coupled to the anode, at least one of the first cathode contact and the first anode contact being disposed across a virtual extending surface of the fuse link.

BRIEF DESCRIPTION OF THE DRAWINGS

The above and other features and advantages of the present invention will become more apparent by describing in detail exemplary embodiments thereof with reference to the attached drawings in which:

FIG. 4 is a diagram illustrating the electrical fuse device of FIG. 2 taken along line IIIb-IIIb' in a programming mode according to an embodiment of the invention;

DETAILED DESCRIPTION OF THE INVENTION

Figure 1:
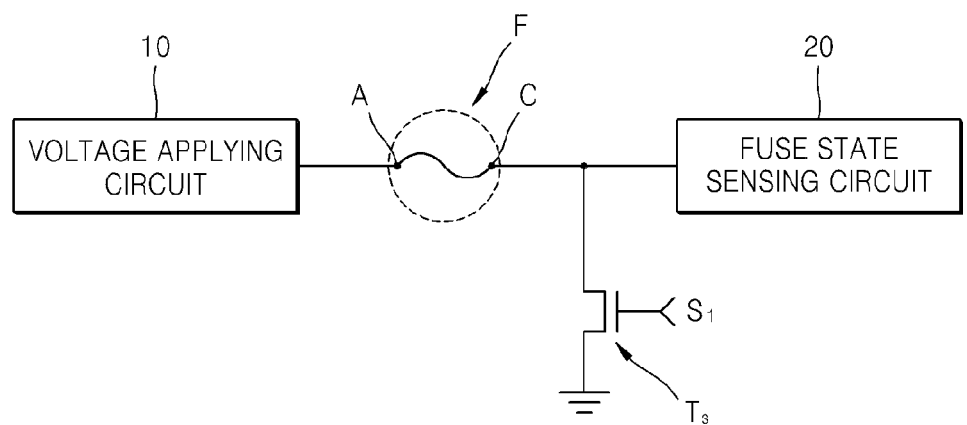
FIG. 1 is an equivalent circuit diagram of an electrical fuse device according to an embodiment of the invention.

Hereinafter, the invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the drawings, it will be understood that when a layer is referred to as being "on" another layer or a substrate, it can be directly on the other layer or the substrate, or intervening layers may also be present.

FIG. 1 is an equivalent circuit diagram of an electrical fuse device according to an embodiment of the invention.

Referring to FIG. 1, an anode A of an electrical fuse device F is connected to a voltage applying circuit 10. A cathode C of the electrical fuse device F is connected to a drain of a selection transistor Ts and a fuse state sensing circuit 20. A source of the selection transistor Ts may be connected to a reference voltage $S_1$, and a gate of the selection transistor Ts may be connected to ground. The voltage applying circuit 10 applies a programming voltage or a sensing voltage to the anode A. The fuse state sensing circuit 20 senses a current flowing through the fuse device F and senses a programming state of the electrical fuse device F.

Figure 2:
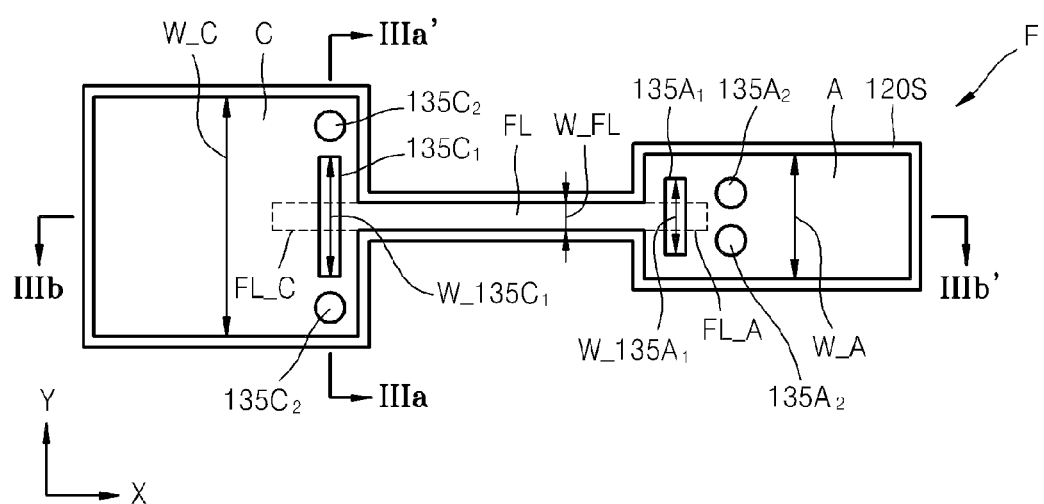
FIG. 2 is a plan view of an electrical fuse device according to an embodiment of the invention.

FIG. 2 is a plan (or layout) view of an electrical fuse device according to an embodiment of the invention.

Referring to FIG. 2, the electrical fuse device F includes the anode A and the cathode C separated from each other on a substrate. In one embodiment of the invention, the anode A and the cathode C may be spaced apart from each other in an X direction. A fuse link FL connected to the anode A and the cathode C is interposed between the anode A and the cathode C. In one embodiment of the invention, the fuse link FL may be extended in an X direction. The fuse link FL may be connected to a center portion of the anode A and a center portion of the cathode C. The width W_FL of the fuse link FL in a Y direction may be less than the width W_C of the cathode C in a Y direction. The width W_FL of the fuse link FL in a Y direction may also be less than the width W_A of the anode A in a Y direction. Here, X and Y directions may be reversed and the directions of elements are not limited thereto.

The width W_FL of the fuse link FL in a Y direction may be the minimum width of a circuit according to a design rule. The anode A, the cathode C, and the fuse link FL may be disposed on the same plane.

The area of the cathode C may be greater than that of the anode A. Accordingly, a metal migration occurring in a direction from the cathode C to the anode A may be smoothly accomplished while programming the fuse device F.

A first cathode contact $135C_1$ is connected to the cathode C. A cathode wiring (e.g., a circuit trace, not shown) may be connected to the upper surface of the first cathode contact $135C_1$. The cathode wiring may also be connected to the drain of the selection transistor Ts of FIG. 1 and the fuse state sensing circuit 20 of FIG. 1. The first cathode contact $135C_1$ may be disposed relatively near the fuse link FL and may be disposed perpendicularly to an extending direction (i.e., the long axis) of the fuse link FL.

A first anode contact $135A_1$ is connected to the anode A. An anode wiring (e.g., a circuit trace, not shown) may be connected to the upper surface of the first anode contact $135A_1$. The anode wiring may also be connected to the voltage applying circuit 10 of FIG. 1. The first anode contact $135A_1$ may be disposed relatively near the fuse link FL and may be disposed perpendicularly to an extending direction (i.e., the long axis) of the fuse link FL.

At least one of the first cathode contact $135C_1$ and the first anode contact $135A_1$ may be disposed to cross a virtual extending surface FL_C and FL_A, respectively, of the fuse link FL. Accordingly, a current density in the fuse link FL according to a potential difference between the first cathode contact $135C_1$ and the first anode contact $135A_1$ may be uniform while programming the fuse device F. As a result, a metal migration uniformly occurs in the fuse link FL so that a fuse programming error can be reduced.

The first cathode contact $135C_1$ may have the width $W\_135C_1$ in a Y direction that is greater than the width $W\_FL$ of the fuse link FL in a Y direction. Thus, even if the first cathode contact $135C_1$ is misaligned in a Y direction, the first cathode contact $135C_1$ may cross the virtual extending surface $FL\_C$ of the fuse link FL. A current density in the fuse link FL may therefore be more uniform while programming the electrical fuse device F. Likewise, the first anode contact $135A_1$ may have the width $W\_135A_1$ in a Y direction that is greater than the width $W\_FL$ of the fuse link FL in a Y direction. So even if the first anode contact $135A_1$ is misaligned in a Y direction, the first anode contact $135A_1$ may cross the virtual extending surface $FL\_A$ of the fuse link FL. Thus a current density in the fuse link FL may be more uniform while programming the electrical fuse device F.

Preferably, the width of the first cathode contact $W\_135C_1$ may be 1.5 times the width $W\_FL$ of the fuse link FL. Similarly, the width of the first anode contact $W\_135A_1$ may also be 1.5 times greater than the width $W\_FL$.

In an alternative embodiment, the width of the first cathode contact $W\_135C_1$ may extend the full width $W\_C$ of the cathode C. In the same or different embodiment, the width of the first anode contact $W\_135A_1$ may extend the full width $W\_A$ of the anode A.

A second cathode contact $135C_2$ may contact the cathode C relatively near the first cathode contact $135C_1$. The cathode wiring (not shown) may also be connected to the second cathode contact $135C_2$. Separately or in combination, a second anode contact $135A_2$ may contact the anode A relatively near the first anode contact $135A_1$. The anode wiring (not shown) may also be connected to the second anode contact $135A_2$. The second cathode contact $135C_2$ and the second anode contact $135A_2$ prevent a current from being centralized in the first cathode contact $135C_1$ and the first anode contact $135A_1$, respectively. Such redundant connections during programming may prevent overheating of the first cathode contact $135C_1$ and the first anode contact $135A_1$.

Figure 3A:
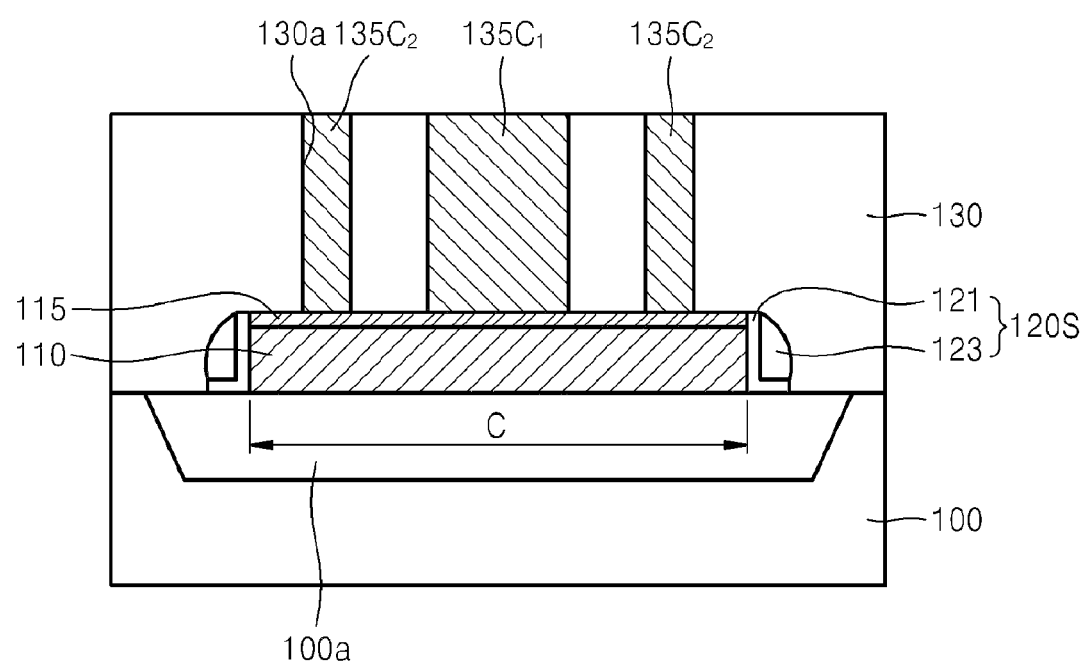
FIGS. 3A and 3B are diagrams respectively illustrating the electrical fuse device of FIG. 2 taken along lines IIIa-IIIa' and IIIb-IIIb' of FIG. 2.
Figure 3B:
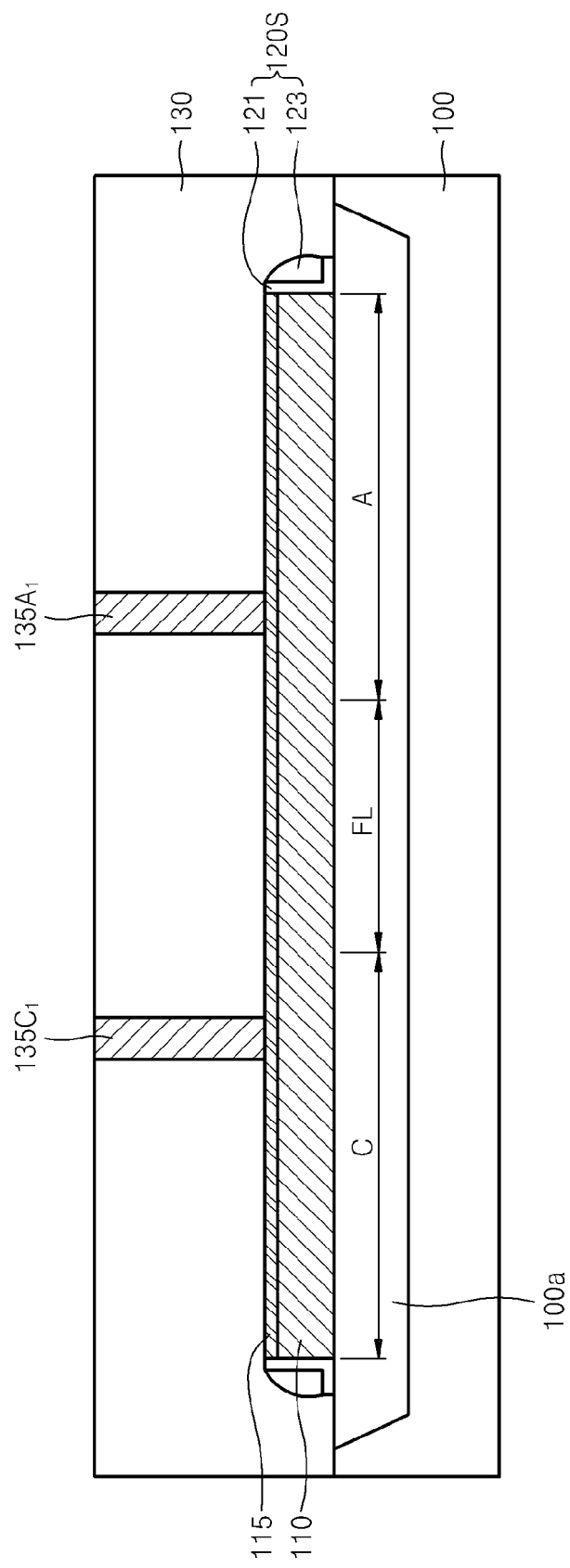

FIGS. 3A and 3B are diagrams respectively illustrating the electrical fuse device of FIG. 2 taken along lines IIIa-IIIa' and IIIb-IIIb' of FIG. 2.

Referring to FIGS. 2, 3A, and 3B, the anode A, the cathode C, and the fuse link FL are disposed on a substrate 100. The anode A, the cathode C, and the fuse link FL may each include a high resistance conductive layer 110 and a low resistance conductive layer 115 that are sequentially stacked. The high resistance conductive layer 110 has relatively large resistance and may be a semiconductor layer, for example, a polysilicon layer or an amorphous silicon layer. The low resistance conductive layer 115 has a resistance lower than that of the high resistance conductive layer 110 and may be, for instance, a metal layer or a metal silicide layer. The metal layer may be or include, for example, tungsten (W), molybdenum (Mo), tantalum (Ta), cobalt (Co), titanium (Ti), aluminum (Al), copper (Cu), platinum (Pt), or an alloy thereof. The metal silicide layer may be or include, for instance, tungsten silicide, molybdenum silicide, titanium silicide, tantalum silicide, hafnium silicide, cobalt silicide, or platinum silicide.

When the high resistance conductive layer 110 is a semiconductor layer and the low resistance conductive layer 115 is a metal layer, an interface control layer (not shown) may be interposed between the high resistance conductive layer 110 and the low resistance conductive layer 115. The interface control layer may include an ohmic contact layer and a barrier layer, wherein the ohmic contact layer reduces a Schottky barrier generated at the interface between the semiconductor layer and the metal layer and the barrier layer suppresses a reaction between the semiconductor layer and the metal layer. The interface control layer may be or include, for example, a titanium layer and a titanium nitride layer that are sequentially stacked.

A first insulating layer $100a$ is disposed in a portion of the anode A, the cathode C, and the fuse link FL. The first insulating layer $100a$ may be, for example, a device isolation layer formed in the substrate 100 or an interlayer insulating layer formed on the substrate 100. The first insulating layer $100a$ may also be a silicon oxide layer.

A spacer pattern 120S may be disposed on the side walls of the anode A, the cathode C, and the fuse link FL. The spacer pattern 120S may include an L-type lower spacer 121 and an upper spacer 123 disposed on a portion of the lower spacer 121. The L-type lower spacer 121 may be or include, for example, a silicon oxide layer. The upper spacer 123 may be or include, for instance, a silicon nitride layer.

The anode A, the cathode C, and the fuse link FL may have a layered structure that is the same as a gate electrode (not shown) formed on another region (not shown) of the substrate 100. In this case, the anode A, the cathode C, the fuse link FL, and the gate electrode may be formed at the same time so that a process of manufacturing a semiconductor device may be simplified.

A second insulating layer 130 may be disposed on the substrate 100 to cover the anode A, the cathode C, the fuse link FL, and the spacer pattern 120S. The second insulating layer 130 may be or include, for instance, a silicon oxide layer. The first and second anode contacts $135A_1$ and $135A_2$ may penetrate the second insulating layer 130 to contact the anode A, and the first and second cathode contacts $135C_1$ and $135C_2$ may penetrate the second insulating layer 130 to contact to the cathode C. The first and second anode contacts $135A_1$ and $135A_2$ and the first and second cathode contacts $135C_1$ and $135C_2$ may be, for example, tungsten plugs that are disposed inside of contact holes $130a$.

FIG. 4 is a diagram illustrating the electrical fuse device of FIG. 2 taken along line IIIb-IIIb' in a programming mode according to an embodiment of the invention.

Referring to FIGS. 1, 2, and 4, the voltage applying circuit 10 is configured to apply a program voltage Vpp to the anode A of the electrical fuse device F through an anode wiring (not shown) and the first anode contact $135A_1$. When a fuse programming signal $S_1$ is applied to a gate of the selection transistor Ts, the selection transistor Ts is turned on and a ground voltage is applied to the cathode C of the electrical fuse device F through a cathode wiring (not shown) and the first cathode contact $135C_1$. As a result, a programming current flows through the electrical fuse device F and is centralized in the low resistance conductive layer 115 included in the fuse link FL.

As described above, at least one of the first cathode contact $135C_1$ and the first anode contact $135A_1$ may be disposed to cross the virtual extending surface $FL\_C$ or $FL\_A$, respectively, of the fuse link FL. Accordingly, a programming current density of the fuse link FL may be uniform. Therefore, metal migration is uniformly generated in the low resistance conductive layer 115 and a portion of the low resistance conductive layer 115 is completely blown. As a result, the electrical fuse device F may be programmed without an error.

Subsequent to the blowing process, the voltage applying circuit 10 may apply a sensing voltage to the anode of the electrical fuse device F through the anode wiring (not shown) and the first anode contact $135C_1$. Since the programmed electrical fuse device F can flow a current only through the high resistance conductive layer 110, the resistance of the programmed electrical fuse device F is higher than the resistance of the electrical fuse device F prior to programming. Such a resistance difference is sensed by the fuse state sensing circuit 20.

Figure 5:
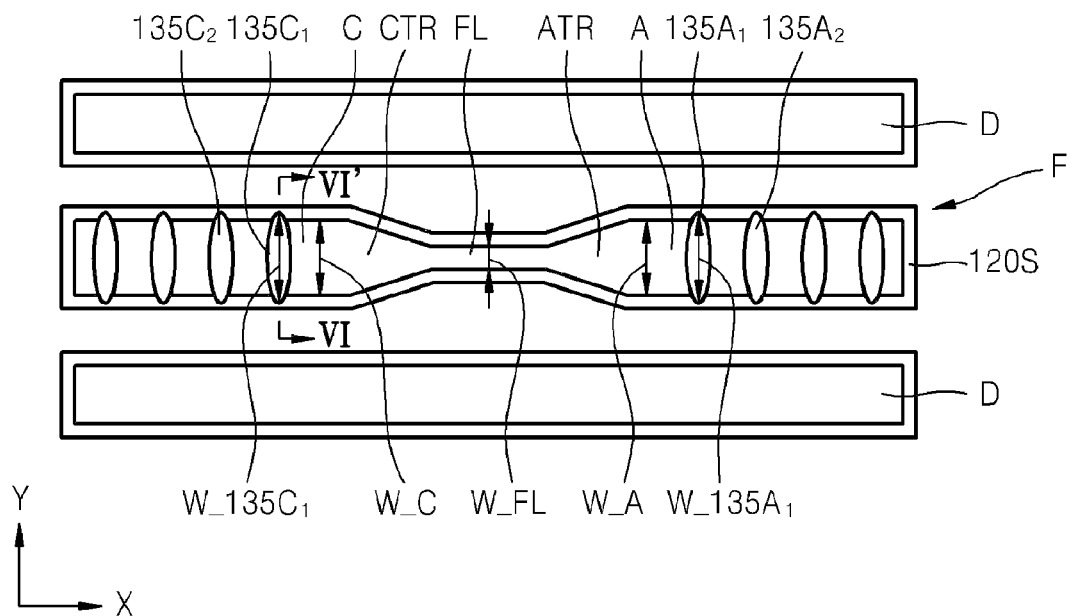
FIG. 5 is a plan view of an electrical fuse device according to another embodiment of the invention.

FIG. 5 is a plan view of an electrical fuse device according to another embodiment of the invention. The electrical fuse device F of the embodiment illustrated in FIG. 5 is similar to that of FIG. 2, except for the details described below.

Referring to FIG. 5, the fuse link FL contacts the anode A and the cathode C and is interposed between the anode A and the cathode C. The area of the cathode C may be substantially the same with the area of the anode A. The width W_FL of the fuse link FL in a Y direction may be less than the width W_C of the cathode C in a Y direction. The width W_FL of the fuse link FL in a Y direction may also be less than the width W_A of the anode A in a Y direction. But the width W_C of the cathode and the width W_A of the anode A may be substantially equal.

A cathode transition region (CTR), a tapered region in which the area thereof is gradually reduced in a fuse link FL direction, may be interposed between the cathode C and the fuse link FL. In addition, an anode transition region (ATR), a tapered region in which the area thereof is gradually reduced in a fuse link FL direction, may be interposed between the anode A and the fuse link FL. The cathode transition region (CTR) and the anode transition region (ATR) facilitate a programming current to be centralized in the fuse link FL. The cathode transition region (CTR) and anode transition region (ATR) can also be applied to the electrical fuse device F illustrated in FIG. 2 where the area of the cathode C exceeds the area of the anode A.

In the embodiment illustrated in FIG. 5, the width W_135C$_1$ exceeds the width of the W_C of the cathode C, and the width W_135A$_1$ exceeds the width W_A of the anode A. In an alternative embodiment (not shown), the width W_135C$_1$ exceeds the width of the W_C of the cathode C, but the width W_135A$_1$ does not exceed the width W_A of the anode A. In yet another embodiment (not shown), the width W_135C$_1$ does not exceed the width of the W_C of the cathode C, but the width W_135A$_1$ does exceed the width W_A of the anode A.

With further reference to the embodiment of FIG. 5, the second cathode contact 135C$_2$ coupled to the cathode C may be disposed relatively near the first cathode contact 135C$_1$. The second cathode contact 135C$_2$ may also be disposed to cross the width W_C of the cathode C. The second anode contact 135A$_2$ coupled to the anode A may be disposed relatively near the first anode contact 135A$_1$. The second anode contact 135A$_2$ may also be disposed to cross the width W_A of the anode A.

Dummy patterns D may be disposed proximate to the electrical fuse device F.

Figure 6:
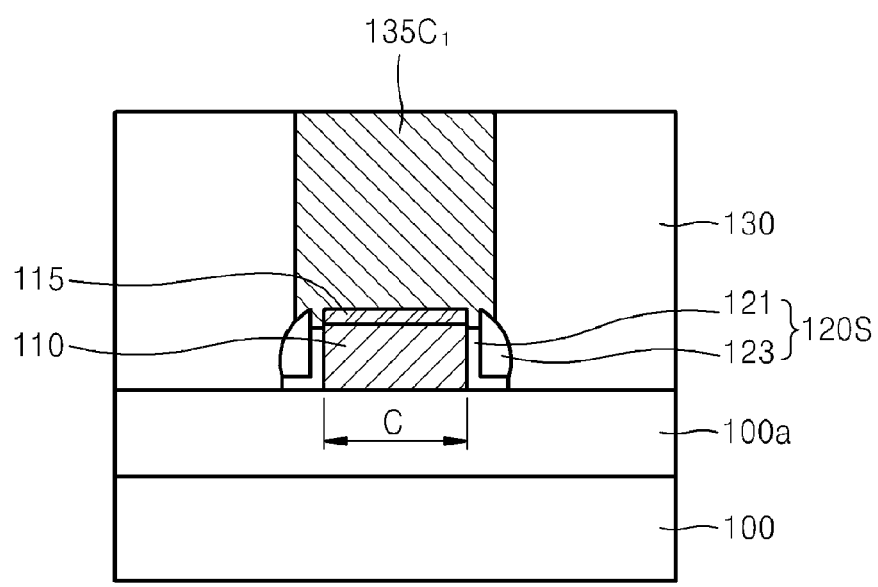
FIG. 6 is a sectional diagram of the electrical fuse device of FIG. 5 taken along the line VI-VI' of FIG. 5.

FIG. 6 is a sectional diagram of the electrical fuse device of FIG. 5 taken along the line VI-VI' of FIG. 5.

Referring to FIGS. 5 and 6, the first cathode contact 135C$_1$ is disposed to cross the width W_C of the cathode C. As illustrated, an upper portion of the spacer pattern 120S may be damaged. However, such damage does not affect an electric property of the electrical fuse device. When the spacer pattern 120S includes a silicon dioxide lower spacer 121 and a silicon nitride upper spacer 123, a portion of the lower spacer 121 may be etched.

Figure 7:
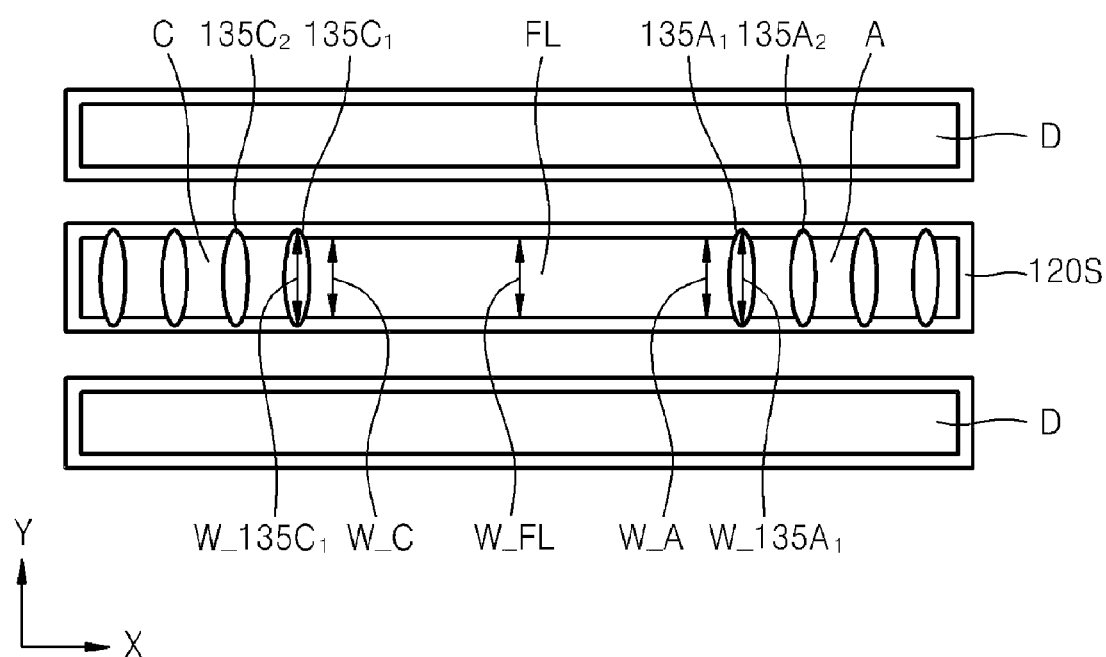
FIG. 7 is a plan view of an electrical fuse device according to yet another embodiment of the invention.

FIG. 7 is a plan view of an electrical fuse device F according to yet another embodiment of the invention. The electrical fuse device F illustrated in FIG. 7 is substantially the same as the fuse device F described above with reference to FIGS. 5 and 6. In the embodiment of FIG. 7, however, the fuse link FL has a width W_FL that is substantially the same as the width W_C of the cathode C and width W_A of the anode A. In other words, in the embodiment of FIG. 7, there is no tapered cathode transition region CTR or tapered anode transition region ATR.

As described above, at least one of the first cathode contact 135C$_1$ and the first anode contact 135A$_1$ may be disposed to cross the virtual extending surface FL_C and FL_A, respectively, of the fuse link FL and thus a current density in the fuse link FL can be uniform while programming the electrical fuse device F. As a result, metal migration in the fuse link FL uniformly occurs so that a fuse programming error can be reduced. The disclosed configuration may also reduce problems associated with misalignment of the first cathode contact 135C$_1$ and/or the first anode contact 135A$_1$ with respect to the fuse link FL.

While the invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electrical fuse device comprising:
   an anode disposed on a substrate, the anode having a width in a first direction and a length in a second direction parallel to the first direction;
   a cathode disposed on the substrate separate from the anode, the cathode having a width parallel to the first direction and a length parallel to the second direction;
   a fuse link extending lengthwise parallel to the second direction between the anode and the cathode, the fuse link coupled to the anode and the cathode, and the fuse link having a width parallel to the first direction;
   a first cathode contact coupled to the cathode, the first cathode contact having a width parallel to the first direction that is greater than the width of the fuse link; and
   a first anode contact coupled to the anode, the first anode contact having a width parallel to the first direction that is greater than the width of the fuse link,
   an anode transition region interposed between the anode and the fuse link, the anode transition region having a width parallel to the first direction,
   wherein the first cathode contact is disposed to cross a virtual extending surface of the fuse link in a cathode direction and the first anode contact is disposed to cross a virtual extending surface of the fuse link in an anode direction,
   wherein the width of the anode, the width of the fuse link, the width of the anode transition region are substantially same.

2. The electrical fuse device of claim 1, further comprising:
   a cathode transition region interposed between the cathode and the fuse link and having a constant width parallel to the first direction.

3. The electrical fuse device of claim 1, further comprising:
   an anode transition region interposed between the anode and the fuse link and having a constant width parallel to the first direction.

4. The electrical fuse device of claim 1, wherein the first cathode contact extends across the cathode.

5. The electrical fuse device of claim 1, wherein the first anode contact extends across the anode.

6. The electrical fuse device of claim 1, further comprising:
   a second cathode contact disposed proximate to the first cathode contact, the second cathode contact being coupled to the cathode.

7. The electrical fuse device of claim 1, further comprising:
a second anode contact disposed proximate to the first anode contact, the second anode contact being coupled to the anode.

8. The electrical fuse device of claim 1, wherein the fuse link including a high-resistance conductive layer and a low-resistance conductive layer that are sequentially stacked.

9. The electrical fuse device of claim 8, wherein the high-resistance conductive layer is one of a polysilicon layer and an amorphous silicon layer and the low-resistance conductive layer is one of a metal layer and a metal silicide layer.

10. The electrical fuse device of claim 9, wherein the metal layer is one of a tungsten (W) layer, a molybdenum (Mo) layer, a tantalum (Ta) layer, a cobalt (Co) layer, a titanium (Ti) layer, an aluminum (Al) layer, a copper (Cu) layer, a platinum (Pt) layer, and wherein the metal silicide layer is one of a tungsten silicide layer, a molybdenum silicide layer, a titanium silicide layer, a tantalum silicide layer, a hafnium silicide layer, a cobalt silicide layer, and a platinum silicide layer.

11. The electrical fuse device of claim 1, further comprising:
a cathode transition region interposed between the cathode and the fuse link, the cathode transition region having a width parallel to the first direction,
wherein the width of the cathode, the width of the fuse link, and the width of the cathode transition region are substantially the same.

* * * * *